US010032603B2

(12) United States Patent
Nakayamada et al.

(10) Patent No.: US 10,032,603 B2
(45) Date of Patent: Jul. 24, 2018

(54) CHARGED PARTICLE BEAM LITHOGRAPHY APPARATUS AND CHARGED PARTICLE BEAM LITHOGRAPHY METHOD

(71) Applicant: NuFlare Technology, Inc., Yokohama-shi (JP)

(72) Inventors: Noriaki Nakayamada, Kamakura (JP); Mizuna Suganuma, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/255,848

(22) Filed: Sep. 2, 2016

(65) Prior Publication Data
US 2017/0069460 A1 Mar. 9, 2017

(30) Foreign Application Priority Data

Sep. 7, 2015 (JP) ................ 2015-175610
Aug. 24, 2016 (JP) ................ 2016-163389

(51) Int. Cl.
H01J 37/317 (2006.01)
H01J 37/302 (2006.01)

(52) U.S. Cl.
CPC ...... H01J 37/3174 (2013.01); H01J 37/3026 (2013.01); *H01J 2237/31764* (2013.01); *H01J 2237/31776* (2013.01)

(58) Field of Classification Search
CPC ............... H01J 37/3026; H01J 37/3174; H01J 2237/31764; H01J 2237/31796
See application file for complete search history.

(56) References Cited

U.S. PATENT DOCUMENTS 6,373,071 B1 4/2002 Innes et al.
6,379,851 B1 4/2002 Innes
(Continued)

FOREIGN PATENT DOCUMENTS

JP 2001-189262 7/2001
JP 2003-503837 1/2003
(Continued)

OTHER PUBLICATIONS

Korean Office Action dated Aug. 2, 2017 in Patent Application No. 10-2016-0110776 (with English translation).
(Continued)

*Primary Examiner* — Eliza Osenbaugh-Stewar
(74) *Attorney, Agent, or Firm* — Oblon, McClelland, Maier & Neustadt, L.L.P.

(57) ABSTRACT

A charged particle beam lithography apparatus according to an embodiment includes: a pattern-writing-data data storage processing circuitry configured to store pattern writing data in association with pattern attribute information; a shot dividing processing circuitry configured to divide the pattern writing data into shot data in association with the pattern attribute information; an indicator data storage processing circuitry configured to store an indicator for determining correction section regions to be merged on calculation in an approximation calculation of heat transfers, the indicator being associated with the pattern attribute information; a pattern writing schedule creator configured to create a pattern writing schedule based on the shot data; an approximation-calculation-method determining processing circuitry configured to determine an approximation calculation method of the heat transfers from other shots written before a shot to be written, the shot being associated with the shot data to be written, based on the pattern writing schedule and the indicator; a thermal diffusion calculator configured to calculate a temperature rise amount caused by the heat transfers from the other shots written before the shot to be written, the shot being associated with the shot data to be written, based on the approximation calculation method; a shot temperature calculator configured to calculate a representative temperature of the shot to be written with the shot data, based on the temperature rise amount; a dose modulator configured to modulate a dose of the shot to be written with the shot data, based on the representative temperature;
(Continued)

and a lithography mechanism including a charged particle beam source, a deflector, and a stage on which the target object is placed, and to perform writing based on a modulated dose and the pattern writing schedule.

2 Claims, 11 Drawing Sheets

(56) References Cited

U.S. PATENT DOCUMENTS

| | | | |
|---|---|---|---|
| 8,563,953 | B2 | 10/2013 | Nakayamada et al. |
| 2013/0316288 | A1* | 11/2013 | Nakayamada ........ G03F 7/2061 430/296 |
| 2015/0060704 | A1* | 3/2015 | Yagawa .............. H01J 37/3175 250/492.22 |

FOREIGN PATENT DOCUMENTS

| | | |
|---|---|---|
| JP | 2004-505462 | 2/2004 |
| JP | 3708858 | 10/2005 |
| JP | 4801982 | 10/2011 |
| JP | 2013-243285 | 12/2013 |
| JP | 5636238 | 12/2014 |
| KR | 10-2014-0118857 A | 10/2014 |

OTHER PUBLICATIONS

Korean Office Action dated Feb. 7, 2018, issued in Korean Patent Application No. 10-2016-0110776 (with English translation).

\* cited by examiner

CHARGED PARTICLE BEAM LITHOGRAPHY APPARATUS AND CHARGED PARTICLE BEAM LITHOGRAPHY METHOD

CROSS-REFERENCE TO RELATED APPLICATION

This application is based upon and claims the benefit of priority from Japanese Patent Applications No. 2015-175610, filed on Sep. 7, 2015 and Japanese Patent Applications No. 2016-163389, filed on Aug. 24, 2016, the entire contents of which are incorporated herein by reference.

FIELD OF THE INVENTION

Embodiments described herein relate generally to a charged particle beam lithography apparatus and a charged particle beam lithography method.

BACKGROUND OF THE INVENTION

A lithography technique leads development of miniaturization of semiconductor devices. The lithography technique is the only extremely important process that generates a pattern, in semiconductor manufacturing processes. Recently, as LSIs have been highly integrated, a circuit pattern linewidth required for the semiconductor devices has been miniaturized every year. A high-precision original pattern (also referred to as a reticle or a mask) is required in order to form a desired circuit pattern to the semiconductor devices. An electron beam (EB) lithography technique has essentially excellent resolution. The electron beam lithography technique is used for manufacturing high-precision original patterns.

FIG. 11 is a schematic view for describing operation of a variable-shaped electron beam lithography apparatus in the related art. The variable-shaped electron beam lithography apparatus is an example of variable-shaped charged particle beam lithography apparatuses. The variable-shaped electron beam lithography apparatus operates as follows: A quadrilateral opening 411 for forming an electron beam 330 is formed on a first aperture plate 410. A variable-shaped opening 421 is formed on a second aperture plate 420. The variable-shaped opening 421 forms the electron beam 330 that has passed through the opening 411 of the first aperture plate 410, into a desired quadrilateral shape. The electron beam 330 that has been irradiated from a charged particle beam source 430 and has passed through the opening 411 of the first aperture plate 410 is deflected by a deflector. Then, the electron beam 330 passes through a part of the variable-shaped opening 421 of the second aperture plate 420. After that, a target object 340 mounted on a stage continuously movable in a predetermined direction (for example, in an X direction), is irradiated with the electron beam 330. That is, a quadrilateral shape capable of passing through both the opening 411 of the first aperture plate 410 and the variable-shaped opening 421 of the second aperture plate 420, is written in a pattern writing region of the target object 340 mounted on the stage continuously movable in the X direction. A method for forming an arbitrary shape by causing the electron beam 330 to pass through both the opening 411 of the first aperture plate 410 and the variable-shaped opening 421 of the second aperture plate 420 is referred to as a variable-shaped method (VSB method).

The number of shots of the electron beam, required for forming a mask pattern, has increased at an accelerated rate in association with the development of a photolithography technique by introducing the shorter wavelength of Extreme Ultra Violet (EUV) light. Meanwhile, in order to secure linewidth precision necessary for miniaturization, making a resist have low sensitivity and increasing a dose achieve reduction of shot noise and edge roughness of a pattern. In this manner, the number of shots and the dose have boundlessly continued to increase. Thus, pattern writing time boundlessly increases. Therefore, it has been examined that increasing current density achieves reduction in the pattern writing time.

However, when a further high-density electron beam irradiates an amount of irradiation energy that has increased, in a short time, the temperature of a substrate increases and the sensitivity of the resist varies. That is, there is a problem that a phenomenon referred to resist heating occurs.

JP 2013-243285 A describes a lithography apparatus including a number operation unit, a representative temperature calculator, and a dose modulator. In order to inhibit a size variation of a pattern due to resist heating while a correction calculating speed is caused not to be late for a pattern writing speed, with average pattern writing time of a TF (under-subfield), average calculating time for calculating a temperature rise amount caused by a heat transfer of each of a plurality of other TFs written before the TF, and parallelism of a calculator, the number operation unit operates the number of the plurality of other TFs, written before the TF, used when a temperature rise amount for causing calculating time for calculating an temperature rise amount of all TFs to be written not to exceed pattern writing time of all the TFs, is calculated. The representative temperature calculator calculates a representative temperature of the TF based on a heat transfer from the number of the plurality of other TFs with respect to each TF. The dose modulator inputs a dose to be irradiated to the TF and modulates the dose to be irradiated to the TF with the representative temperature of the TF.

SUMMARY OF THE INVENTION

A charged particle beam lithography apparatus according to an embodiment includes: a pattern-writing-data data storage processing circuitry configured to store pattern writing data in association with pattern attribute information; a shot dividing processing circuitry configured to divide the pattern writing data into shot data in association with the pattern attribute information; an indicator data storage processing circuitry configured to store an indicator for determining correction section regions to be merged on calculation in an approximation calculation of heat transfers, the indicator being associated with the pattern attribute information; a pattern writing schedule creator configured to create a pattern writing schedule based on the shot data; an approximation-calculation-method determining processing circuitry configured to determine an approximation calculation method of the heat transfers from other shots written before a shot to be written, the shot being associated with the shot data to be written, based on the pattern writing schedule and the indicator; a thermal diffusion calculator configured to calculate a temperature rise amount caused by the heat transfers from the other shots written before the shot to be written, the shot being associated with the shot data to be written, based on the approximation calculation method; a shot temperature calculator configured to calculate a representative temperature of the shot to be written with the shot data, based on the temperature rise amount; a dose modulator configured to modulate a dose of the shot to be written with the shot data, based on the representative temperature; and a lithography mechanism including a charged particle beam source, a deflector, and a stage on which the target object is placed, and to perform writing based on a modulated dose and the pattern writing schedule.

A charged particle beam lithography method according to the embodiment includes: dividing pattern writing data in association with pattern attribute information into shot data in association with the pattern attribute information; creating a pattern writing schedule based on the shot data; determining an approximation calculation method of heat transfers from other shots written before a shot to be written, the shot being associated with the shot data to be written, based on the pattern writing schedule and an indicator for determining correction section regions to be merged on calculation in an approximation calculation of heat transfers, the indicator being associated with the pattern attribute information; calculating a temperature rise amount caused by the heat transfers from the other shots written before the shot to be written, the shot being associated with the shot data to be written, based on the approximation calculation method; calculating a representative temperature of the shot to be written with the shot data, based on the temperature rise amount; modulating a dose of the shot to be written with that shot data, based on the representative temperature; and performing writing based on a modulated dose and the pattern writing schedule.

DETAILED DESCRIPTION OF THE EMBODIMENTS

Embodiments of the present disclosure will be described with reference to the drawings.

A configuration with an electron beam will be described below as an exemplary charged particle beam in the embodiments. Note that the charged particle beam is not limited to the electron beam, and may be a beam using charged particles, such as an ion beam. A variable-shaped lithography apparatus will be described as an exemplary charged particle beam apparatus.

First Embodiment

A charged particle beam lithography apparatus according to the present embodiment includes: a pattern-writing-data data storage processing circuitry configured to store pattern writing data in association with pattern attribute information; a shot dividing processing circuitry configured to divide the pattern writing data into shot data in association with the pattern attribute information; an indicator data storage processing circuitry configured to store an indicator for determining correction section regions to be merged on calculation in an approximation calculation of heat transfers, the indicator being associated with the pattern attribute information; a pattern writing schedule creator configured to create a pattern writing schedule based on the shot data; an approximation-calculation-method determining processing circuitry configured to determine an approximation calculation method of the heat transfers from other shots written before a shot to be written, the shot being associated with the shot data to be written, based on the pattern writing schedule and the indicator; a thermal diffusion calculator configured to calculate a temperature rise amount caused by the heat transfers from the other shots written before the shot to be written, the shot being associated with the shot data to be written, based on the approximation calculation method; a shot temperature calculator configured to calculate a representative temperature of the shot to be written with the shot data, based on the temperature rise amount; a dose modulator configured to modulate a dose of the shot to be written with the shot data, based on the representative temperature; and a lithography mechanism including a charged particle beam source, a deflector, and a stage on which the target object is placed, and to perform writing based on a modulated dose and the pattern writing schedule.

Figure 1:
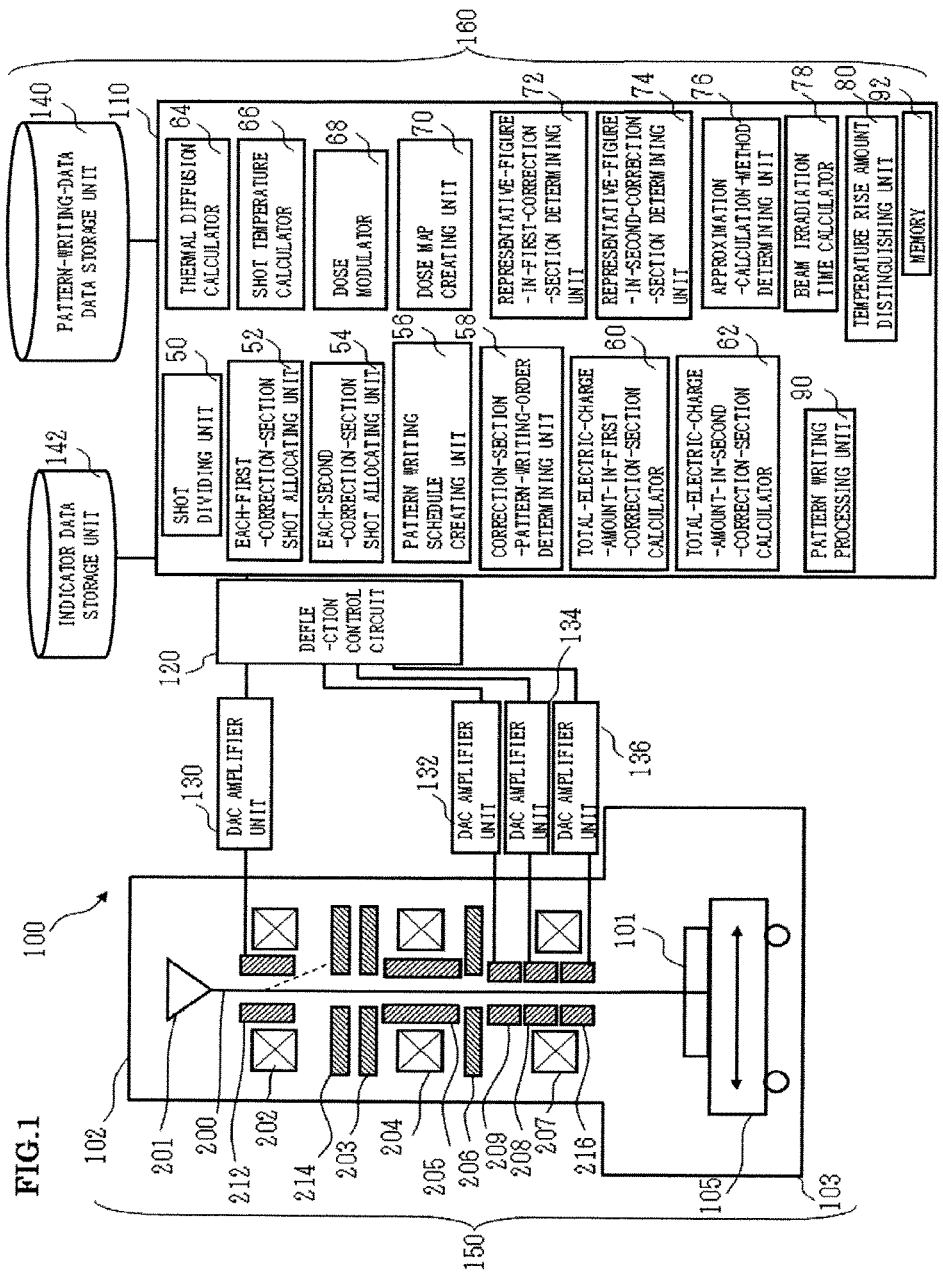
FIG. 1 is a conceptual diagram of a configuration of a lithography apparatus according to a first embodiment.

FIG. 1 is a conceptual diagram of a configuration of the lithography apparatus or the writing apparatus or the drawing apparatus according to the present embodiment. The lithography apparatus 100 includes the lithography mechanism 150 and a controller 160. The lithography apparatus 100 is an exemplary charged particle beam lithography apparatus. In particular, the lithography apparatus is an exemplary variable-shaped (VSB-typed) lithography apparatus. The lithography mechanism 150 includes an electron optical column 102 and a pattern writing chamber 103. An electron gun assembly or a charged particle beam source 201, an illumination lens 202, a blanking deflector (blanker) 212, a blanking aperture plate 214, a first forming aperture plate 203, a projection lens 204, a deflector 205, a second forming aperture plate 206, an objective lens 207, a main deflector 208, a sub-deflector 209, and an tertiary deflector 216 are disposed in the electron optical column 102. An XY stage 105 at least movable in XY directions is disposed in the pattern writing chamber 103. A target object 101 (substrate) to be written, coated with a resist, is disposed on the XY stage 105. The target object 101 includes, for example, an exposure mask and a silicon wafer for manufacturing a semiconductor device. The mask includes a mask blank.

The controller 160 includes a control computer unit 110, a deflection control circuit 120, digital-analog converter (DAC) amplifier units 130, 132, 134, and 136 (deflection amplifiers), a pattern-writing-data data storage unit 140, and an indicator data storage unit 142. Each of the pattern-writing-data data storage unit 140 and the indicator data storage unit 142 includes a storage device, such as a magnetic disk drive. The control computer unit 110, the deflection control circuit 120, the pattern-writing-data data storage unit 140, and the indicator data storage unit 142 are coupled to each other through a bus not illustrated. The DAC amplifier units 130, 132, 134, and 136 are coupled to the deflection control circuit 120. The DAC amplifier unit 130 is coupled to the blanking deflector 212. The DAC amplifier unit 132 is coupled to the sub-deflector 209. The DAC amplifier unit 134 is coupled to the main deflector 208. The DAC amplifier unit 136 is coupled to the tertiary deflector 216.

The shot dividing unit 50, an each-first-correction-section shot allocating unit (an each-first-correction-section shot allocator) 52, an each-second-correction-section shot allocating unit (an each-second-correction-section shot allocator) 54, a pattern writing schedule creating unit (a pattern writing schedule creator) 56, a correction-section-pattern-writing-order determining unit 58, a total-electric-charge-amount-in-first-correction-section calculator 60, a total-electric-charge-amount-in-second-correction-section calculator 62, a thermal diffusion calculator 64, a shot temperature calculator 66, a dose modulator 68, a dose map creating unit (a dose map creator) 70, a representative-figure-in-first-correction-section determining unit 72, a representative-figure-in-second-correction-section determining unit 74, an approximation-calculation-method determining unit 76, a beam irradiation time calculator 78, a temperature rise amount distinguishing unit 80, a pattern writing processing unit 90, and a memory 92 are disposed in the control computer unit 110. Each unit, such as the shot dividing unit 50, the each-first-correction-section shot allocating unit 52, the each-second-correction-section shot allocating unit 54, the pattern writing schedule creating unit 56, the correction-section-pattern-writing-order determining unit 58, the total-electric-charge-amount-in-first-correction-section calculator 60, the total-electric-charge-amount-in-second-correction-section calculator 62, the thermal diffusion calculator 64, the shot temperature calculator 66, the dose modulator 68, the dose map creating unit 70, the representative-figure-in-first-correction-section determining unit 72, the representative-figure-in-second-correction-section determining unit 74, the approximation-calculation-method determining unit 76, the beam irradiation time calculator 78, the temperature rise amount distinguishing unit 80, the pattern writing processing unit 90, includes a processing circuitry. As the processing circuitry, for example, an electric circuit, computer, processor, circuit board, quantum circuit, semiconductor device, or the like can be used. Each unit may use a common processing circuitry (same processing circuitry), or different processing circuitries (separate processing circuitries).

The pattern-writing-data data storage unit 140 stores pattern writing data in association with pattern attribute information.

The indicator data storage unit 142 stores an indicator for determining a deflection region in which merger is performed on calculation in an approximation calculation of a heat transfer, in association with the pattern attribute information. Here, the deflection region is an exemplary correction section region.

Here, FIG. 1 illustrates the configuration necessary for describing the present embodiment. The lithography apparatus 100 may typically include necessary other configurations.

Figure 2:
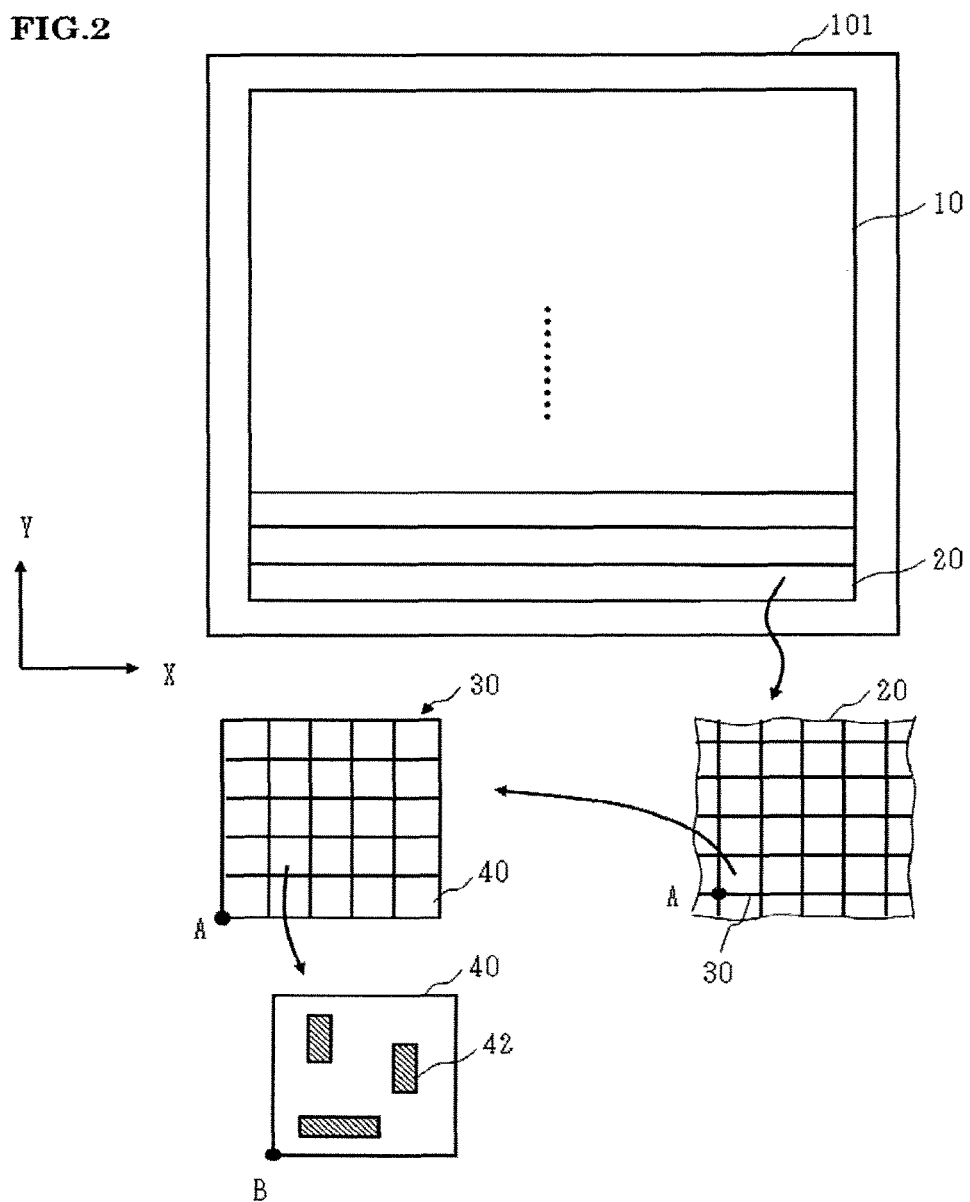
FIG. 2 is a conceptual diagram for describing each region according to the first embodiment.

FIG. 2 is a conceptual diagram for describing each region according to the present embodiment. In FIG. 2, a pattern writing region 10 of the target object 101 is, for example, virtually divided into a plurality of stripe regions 20 rectangular in the y direction in a deflectable width of the main deflector 208. Each of the stripe regions 20 is virtually divided into a plurality of subfields (SF) 30 mesh-shaped in a deflectable size of the sub-deflector 209. Each of the SFs 30 is virtually divided into a plurality of under-subfields (USF: hereinafter, referred to as TF using an abbreviation of tertiary field which means a third deflection region here) 40 mesh-shaped in a deflectable size of the tertiary deflector 216. A shot figure is written at each shot position 42 of each of the TFs 40. The number of TF divisions in each of the SFs is preferably an approximate number with which the speed of pattern writing operation is prevented from being limited due to a thermal diffusion calculation of the TFs 40. For example, the number of TF divisions preferably includes 10 or less in length and width. More preferably, the number of TF divisions includes five or less in length and width.

The deflection control circuit 120 outputs a digital signal for blanking control, to the DAC amplifier unit 130. The DAC amplifier unit 130 converts the digital signal into an analog signal. The DAC amplifier unit 130 amplifies the analog signal and applies the amplified signal, as a deflection voltage, to the blanking deflector 212. An electron beam 200 is deflected by the deflection voltage. Then, a beam each shot is formed.

The deflection control circuit 120 outputs a digital signal for main deflection control, to the DAC amplifier unit 134. The DAC amplifier unit 134 converts the digital signal into an analog signal. The DAC amplifier unit 134 amplifies the analog signal and applies the amplified signal, as a deflection voltage, to the main deflector 208. The electron beam 200 is deflected by the deflection voltage. Then, the beam each shot is deflected at a reference position of each of the predetermined subfields (SFs) virtually divided to be mesh-shaped.

The deflection control circuit 120 outputs a digital signal for sub-deflection control, to the DAC amplifier unit 132. The DAC amplifier unit 132 converts the digital signal into an analog signal. The DAC amplifier unit 132 amplifies the analog signal and applies the amplified signal, as a deflection voltage, to the sub-deflector 209. The electron beam 200 is deflected by the deflection voltage. A beam each shot is deflected at a reference position of each of the under-subfields (TFs) to be a minimum deflection region, further virtually divided to be mesh-shaped in each of the predetermined subfields (SFs) virtually divided to be mesh-shaped.

The deflection control circuit 120 outputs a digital signal for tertiary deflection control, to the DAC amplifier unit 136. The DAC amplifier unit 136 converts the digital signal into an analog signal. The DAC amplifier unit 136 amplifies the analog signal and applies the amplified signal, as a deflection voltage, to the tertiary deflector 216. The electron beam 200 is deflected by the deflection voltage. A beam each shot is deflected at each shot position in each of the under-subfields (TFs) to be the minimum deflection region, further virtually divided to be mesh-shaped in each of the predetermined subfields (SFs) virtually divided to be mesh-shaped.

The lithography apparatus 100 uses a deflector including a plurality of stages so as to cause pattern writing processing to proceed in each of the stripe regions 20. Here, an exemplary three-stage deflector including the main deflector 208, the sub-deflector 209, and the tertiary deflector 216, is used. Writing proceeds in the x direction in a first stripe region 20 with, for example, the XY stage 105 continuously moving in a direction opposite to the x direction. After the writing in the first stripe region 20 has been completed, writing in a second stripe region 20 proceeds similarly or in a direction opposite to the x direction. After that, similarly, writing proceeds in third and subsequent stripe regions 20. The main deflector 208 (first deflector) deflects the electron beam 200 in sequence at the reference position A of each of the SFs 30 to follow up a movement of the XY stage 105. The sub-deflector 209 (second deflector) deflects the electron beam 200 in sequence from the reference position A of each of the SFs 30 to the reference position B of each of the TFs 40. The tertiary deflector 216 (third deflector) deflects the electron beam 200 from the reference position B of each of the TFs 40 to each of the shot positions 42 of the beam to be irradiated in each of the TFs 40. In this manner, the main deflector 208, the sub-deflector 209, and the tertiary deflector 216 each include a deflection region having a different size. Each of the TFs 40 is the minimum deflection region in the deflection regions of the deflector including the plurality of stages.

A first correction section region and a second correction section region will be described below as a TF 40 and a SF 30, respectively. However, the first correction section region and the second correction section region are not limited to the TF 40 and the SF 30, respectively. An individual region instead of the TF 40 and the SF 30 may be the first correction section region or the second correction section region. The size of the individual region is preferably smaller than that of the SF 30.

Figure 3:
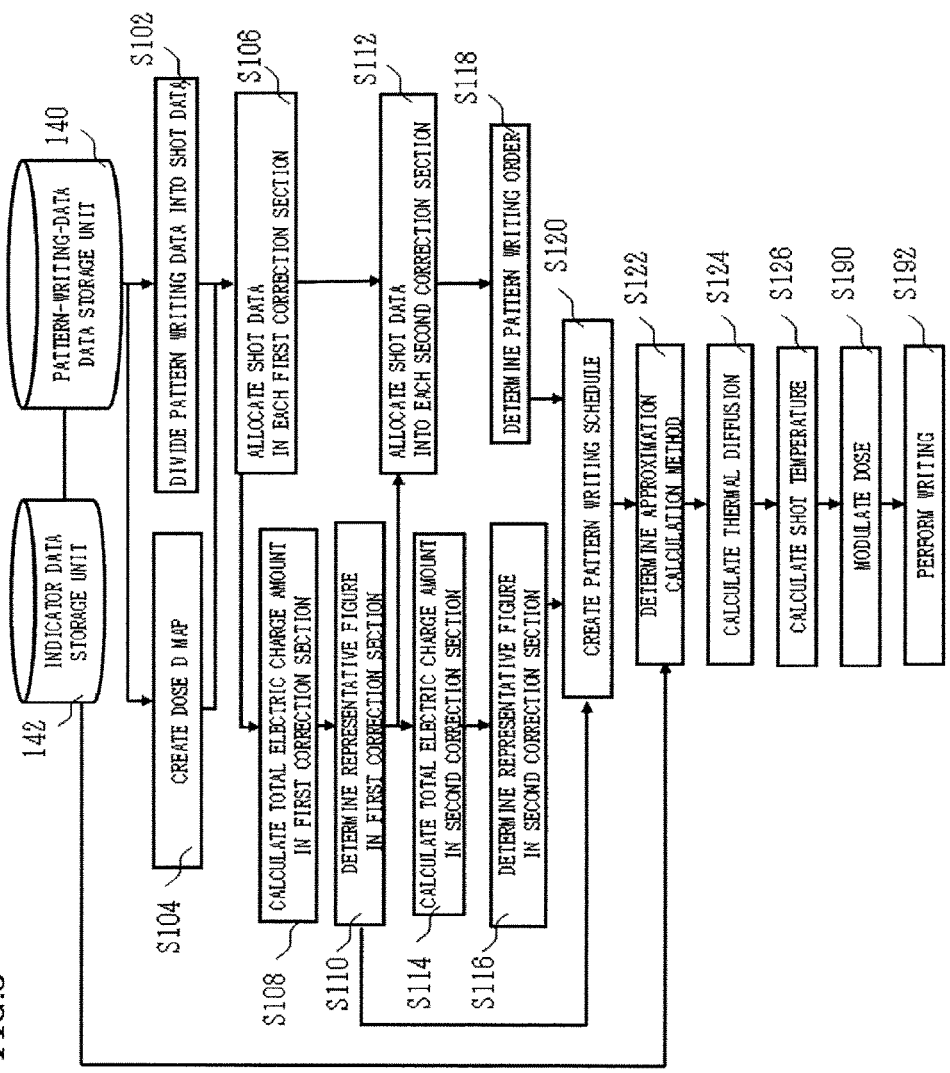
FIG. 3 is a flow chart of main processes of a lithography method according to the first embodiment.

FIG. 3 is a flow chart of main processes of a lithography method according to the present embodiment. The lithography method according to the present embodiment, performs a series of processes including a shot dividing process (S102), a dose D map creating process (S104), an each-first-correction-section shot allocating process (S106), a total-electric-charge-amount-in-first-correction-section calculating process (S108), a representative-figure-in-first-correction-section determining process (S110), an each-second-correction-section shot allocating process (S112), a total-electric-charge-amount-in-second-correction-section calculating process (S114), a representative-figure-in-second-correction-section determining process (S116), a pattern-writing-order determining process (S118), a pattern writing schedule creating process (S120), an approximation-calculation-method determining process (S122), a thermal diffusion calculating process (S124), a shot temperature calculating process (S126), a dose modulating process (S190), and a pattern writing process (S192).

In the shot dividing process (S102), the shot dividing unit 50 inputs, from the pattern-writing-data data storage unit 140, the pattern writing data in association with the pattern attribute information, and divides the pattern writing data into shot data in association with the pattern attribute information.

In the dose D map creating process (S104), the dose map creating unit 70 calculates a dose necessary for each mesh region having a predetermined size. The mesh region is, for example, a correction section region. A dose map is created for the entire pattern writing region or each of the stripe regions. For example, in a case where a proximity effect is corrected, a dose necessary for each proximity effect mesh region is preferably calculated. A size of each proximity effect mesh region is preferably a size of approximately one-tenth of a range of influence of the proximity effect. For example, approximately 1 µm is preferable. Here, the dose D map creating process (S104) and the shot dividing process (S102) are preferably processed in parallel. Note that, the processes are not limited to this, and may be performed in series. In this case, any of the processes may be performed first in order.

In the each-first-correction-section shot allocating process (S106), the first each-correction-section shot allocating unit 52 allocates each of the pieces of shot data that has been shot-divided, to each of the TFs 40 in which a shot figure corresponding to each of the pieces of shot data is disposed.

In the total-electric-charge-amount-in-first-correction-section calculating process (S108), the total-electric-charge-amount-in-first-correction-section calculating unit 60 calculates a total electric charge amount of the electron beam 200 irradiated in each of the TFs 40. The TF 40 is to be a minimum deflection region. The total electric charge amount Q is calculated by the sum of products of an area and a dose of each shot figure irradiated in each of the TFs 40. An index of a TF 40 to be noted is defined as i'. The total electric charge amount Q(i') in the TF 40 can be defined by the following Mathematical Formula (1) using an area $S(i)$ and a dose amount $D(i)$ of a i-th shot in the TF 40 to be noted. The $D(i)$ and the $S(i)$ may be operated through the shot dividing process (S102), the dose D map creating process (S104), and the each-first-correction-section shot allocating process (S106).

[Mathematical Formula 1]

$$Q(i') = \sum_i D(i)S(i) \qquad (1)$$

In the representative-figure-in-first-correction-section determining process (S110), the representative-figure-in-first-correction-section determining unit 72 creates a representative figure having an area equivalent to a total area of all shots positioned in each of the TFs 40. A shape of the representative figure is, for example, square. The center of the representative figure is, for example, positioned at the same location as a location at which the center of gravity of all of the shots positioned in each of the TFs 40 is positioned.

In the each-second-correction-section shot allocating process (S112), the each-second-correction-section shot allocating unit 54 allocates each of the pieces of shot data that has been shot-divided, to each of the SFs 30 in which a shot figure corresponding to each of the pieces of shot data is disposed.

In the total-electric-charge-amount-in-second-correction-section calculating process (S114), the total-electric-charge-amount-in-second-correction-section calculator 62 calculates a total electric charge amount of the electron beam 200 irradiated in each of the SFs 30. The total electric charge amount is calculated by the sum of products of an area and a dose of each shot figure irradiated in each of the SFs 30.

In the representative-figure-in-second-correction-section determining process (S116), the representative-figure-in-second-correction-section determining unit 74 creates a representative figure having an area equivalent to a total area of all shots positioned in each of the SFs 30. A shape of the representative figure is, for example, square. The center of the representative figure is, for example, at the same location as a location at which the center of gravity of all of the shots positioned in each of the SFs 30.

In the pattern-writing-order determining process (S118), the correction-section-pattern-writing-order determining unit 58 determines a pattern writing order of each of the SFs 30 and the TFs 40.

Figure 4:
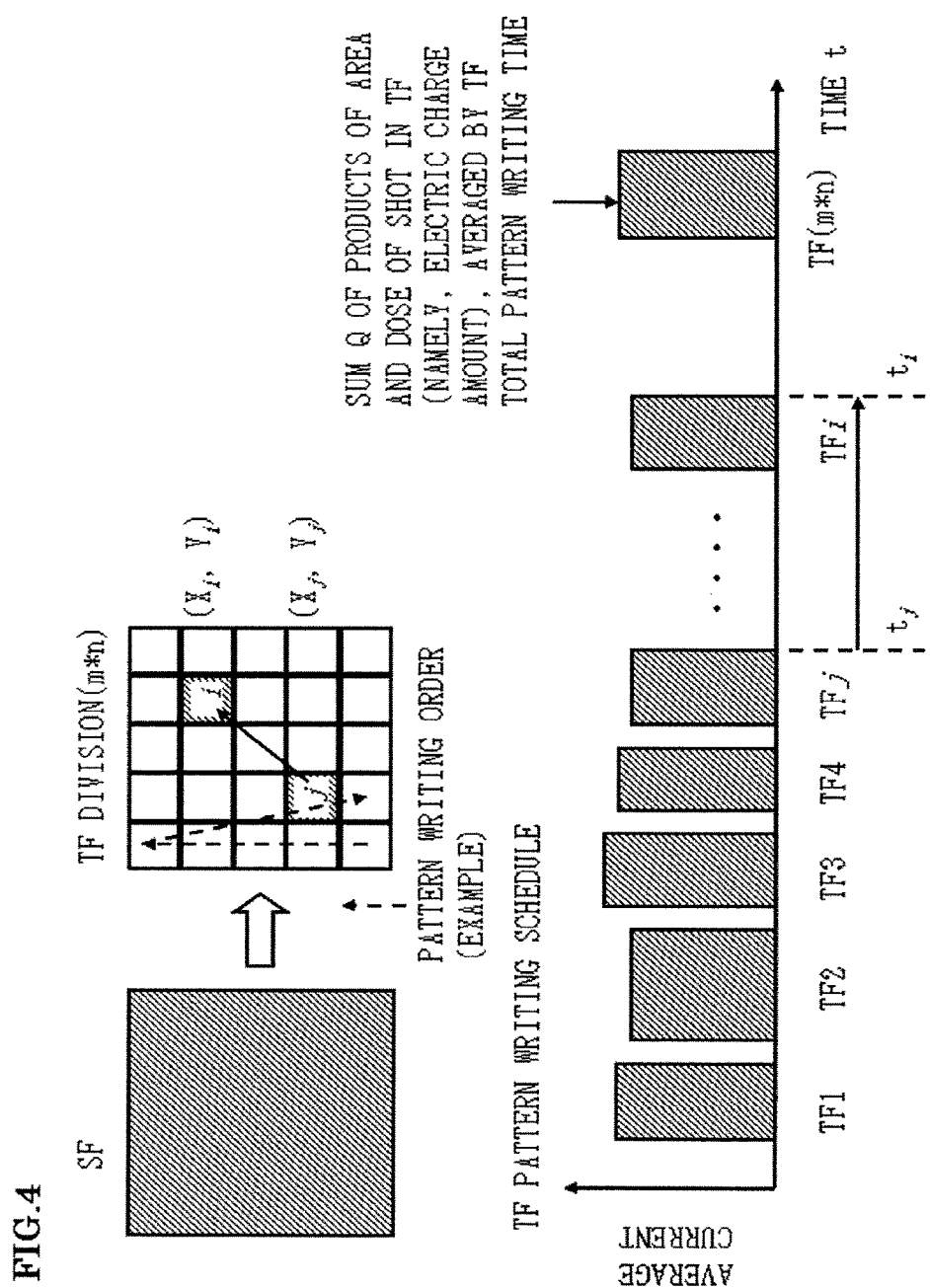
FIG. 4 is a conceptual diagram of tertiary field (TF) pattern writing order in a subfield (SF) according to the first embodiment.

FIG. 4 is a conceptual diagram of a TF pattern writing schedule in each of the SFs and the total electric charge amount of each of the TFs according to the present embodiment. In FIG. 4, for example, a TF line in a first line in the x direction is written in sequence in the y direction from a TF disposed at a lower left in each of the SFs. After the writing in the first line in the x direction has been completed, each TF in a TF line in a second line in the x direction is written in sequence in the y direction. Similarly, each TF in a TF line in third and subsequent lines in the x direction is written in sequence in the y direction. The example in FIG. 4 illustrates a case where writing is performed in the above pattern writing schedule. In FIG. 4, an average current obtained by dividing the total electric charge amount Q by pattern writing time of each of the TFs, is illustrated in pattern writing order.

Figure 5:
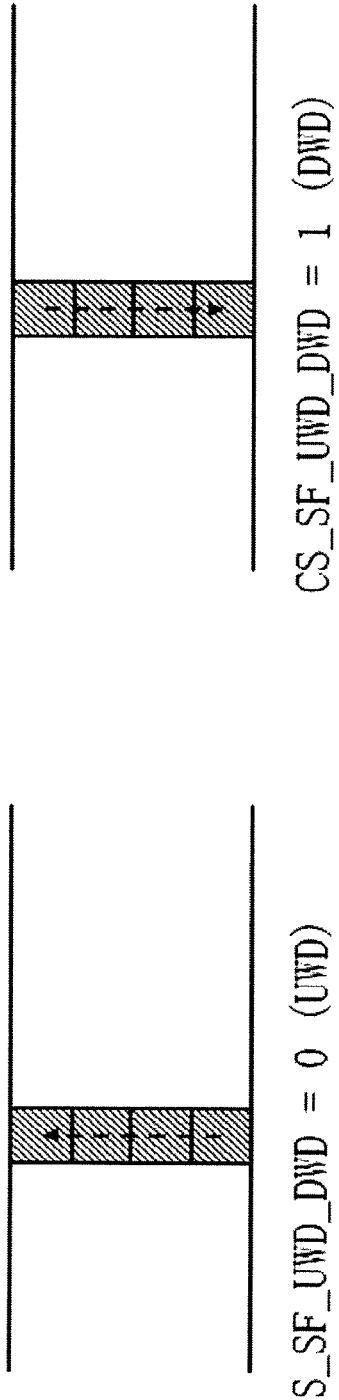
FIG. 5 is a conceptual diagram of exemplary pieces of SF pattern writing order in a stripe region according to the first embodiment.

FIG. 5 is a conceptual diagram of exemplary SF pattern writing order or a conceptual diagram of exemplary SF pattern lithographing order in each of the stripe regions according to the present embodiment. In FIG. 5, two pieces of pattern writing order including upward (UWD) pattern writing order that writes or lithographs in sequence from a lowest SF in the y direction and downward (DWD) pattern writing order that writes in sequence from a highest SF in a direction opposite to the y direction, can be prepared for the SFs in each of the stripe regions in each SF line including the plurality of SFs disposed in each of the stripe regions in the y direction.

Figure 6:
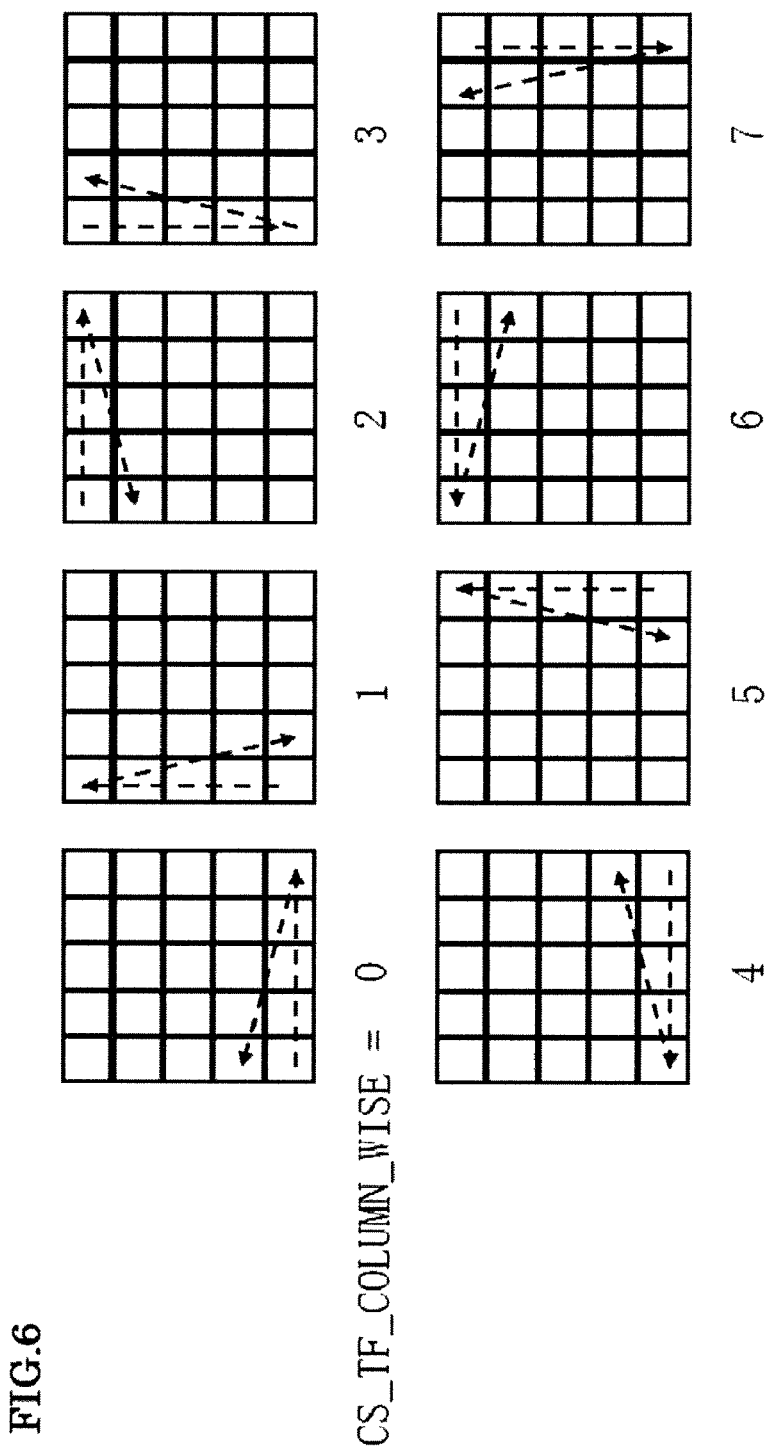
FIG. 6 is a conceptual diagram of exemplary pieces of TF pattern writing order in the SF according to the first embodiment.

FIG. 6 is a conceptual diagram of exemplary pieces of TF pattern writing order in each of the SFs according to the present embodiment. In FIG. 6, pattern writing order (0) that writes a first line in the y direction in sequence from a TF at a lower left in the x direction and also writes second and subsequent lines in the y direction in sequence from a TF at an end of the left side in the x direction, pattern writing order (1) that writes a first line in the x direction in sequence from a TF at a lower left in the y direction and also writes second and subsequent lines in the x direction in sequence from a TF at an end of the lower side in the y direction, pattern writing order (2) that writes a first line in a direction opposite to the y direction in sequence from a TF at an upper left in the x direction and also writes second and subsequent lines in the direction opposite to the y direction in sequence from a TF at an end of the left side in the x direction, pattern writing order (3) that writes a first line in the x direction in sequence from a TF at an upper left in the direction opposite to the y direction and also writes second and subsequent lines in the x direction in sequence from a TF at an end of the upper side in the direction opposite to the y direction, pattern writing order (4) that writes a first line in the y direction in sequence from a TF at a lower right in a direction opposite to the x direction and also writes second line and subsequent lines in the y direction in sequence from a TF at an end of the right side in the direction opposite to the x direction, pattern writing order (5) that writes a first line in the direction opposite to the x direction in sequence from a TF at a lower right in the y direction and also writes second and subsequent lines in the direction opposite to the x direction in sequence from a TF at an end of the lower side in the y direction, pattern writing order (6) that writes a first line in the direction opposite to the y direction in sequence from a TF at an upper right in the direction opposite to the x direction and also writes second and subsequent lines in the direction opposite to the y direction in sequence from a TF at an end of the right side in the direction opposite to the x direction, and pattern writing order (7) that writes a first line in the direction opposite to the x direction in sequence from a TF at an upper right in the direction opposite to the y direction and also writes second and subsequent lines in the direction opposite to the x direction in sequence from a TF at an end of the upper side in the direction opposite to the y direction, can be prepared for the TFs in each of the SFs.

The pattern writing order of each of the SFs and the TFs is at least determined by combining the pieces of pattern writing order in FIGS. 5 and 6. For example, the determination is preferably performed in order in which thermal diffusion barely occurs.

In the pattern writing schedule creating process (S120), the pattern writing schedule creating unit 56 creates a pattern writing schedule based on the pieces of shot data. An exemplary calculation method of pattern writing time $t_i$, of i-th shot 42 will be described. The pattern writing time $t_i$ of the i-th shot 42 is obtained by using the dose amount D(j) of the shots 42 written before the i-th shot 42, current density H of the electron beam 200, and settling time L(j) between a j-th shot and a (j+1)-th shot. The pattern writing time $t_i$ of each shot 42 can be defined by the following Mathematical Formula (2). Note that information on the current density H of the electron beam 200 is at least externally input and determined. Based on externally input settling time information, the settling time L(j) between the j-th shot and the (j+1)-th shot is at least approximately determined in accordance with a distance between the j-th shot and the (j+1)-th shot, or a distance between the TF in which j-th shot is disposed and the TF in which (j+1)-th shot is disposed, or a distance between the SF in which j-th shot is disposed and the SF in which (j+1)-th shot is disposed.

[Mathematical Formula 2]

$$t_i = \sum_{j}^{i-1} \left( \frac{D(j)}{H} + L(j) \right) \quad (2)$$

The pattern writing time $t_j$ of each of the TFs 40 is, for example, able to be defined as an average value of the pattern writing time $t_i$ of all the shots disposed in the TF. The pattern writing time $t_k$ of each of the SFs 30 can be also defined in a similar way.

The above calculation is performed for each of the TFs. Thus, the pattern writing schedule can be determined.

In the approximation-calculation-method determining process (S122), the approximation-calculation-method determining unit 76 determines an approximation calculation method of heat transfers from other shots written before a shot to be written, with shot data to be written, based on the pattern writing schedule created by the pattern writing schedule creating unit 56 and the indicator stored in the indicator data storage unit 142.

Table 1 illustrates, as an indicator, the number of correction section regions, in response to each AI value, in which merger is not performed on calculation upon the approximation calculation of the heat transfers. The AI values are the exemplary pattern attribute information.

TABLE 1

| AI value | Number of TFs with shots not merged | Number of SFs with TFs not merged |
|---|---|---|
| 0 | ∞ | ∞ |
| 1 | 200 | 10 |
| 2 | 1 | 1 |

In a case where the AI value is zero, the number of TFs in which shots are not merged on calculation is infinite, and the number of SFs in which TFs are not merged on calculation is infinite. That is, merger is not performed for pattern writing data in association with an AI value of zero. The pattern writing data in association with an AI value of zero is pattern writing data requiring the highest precision.

In a case where the AI value is 1, the number of TFs in which shots are not merged on calculation is 200, and the number of SFs in which TFs are not merged on calculation is 10. The pattern writing data in association with an AI value of one is pattern writing data requiring higher precision following the pattern writing data in association with an AI value of zero.

Figure 7:
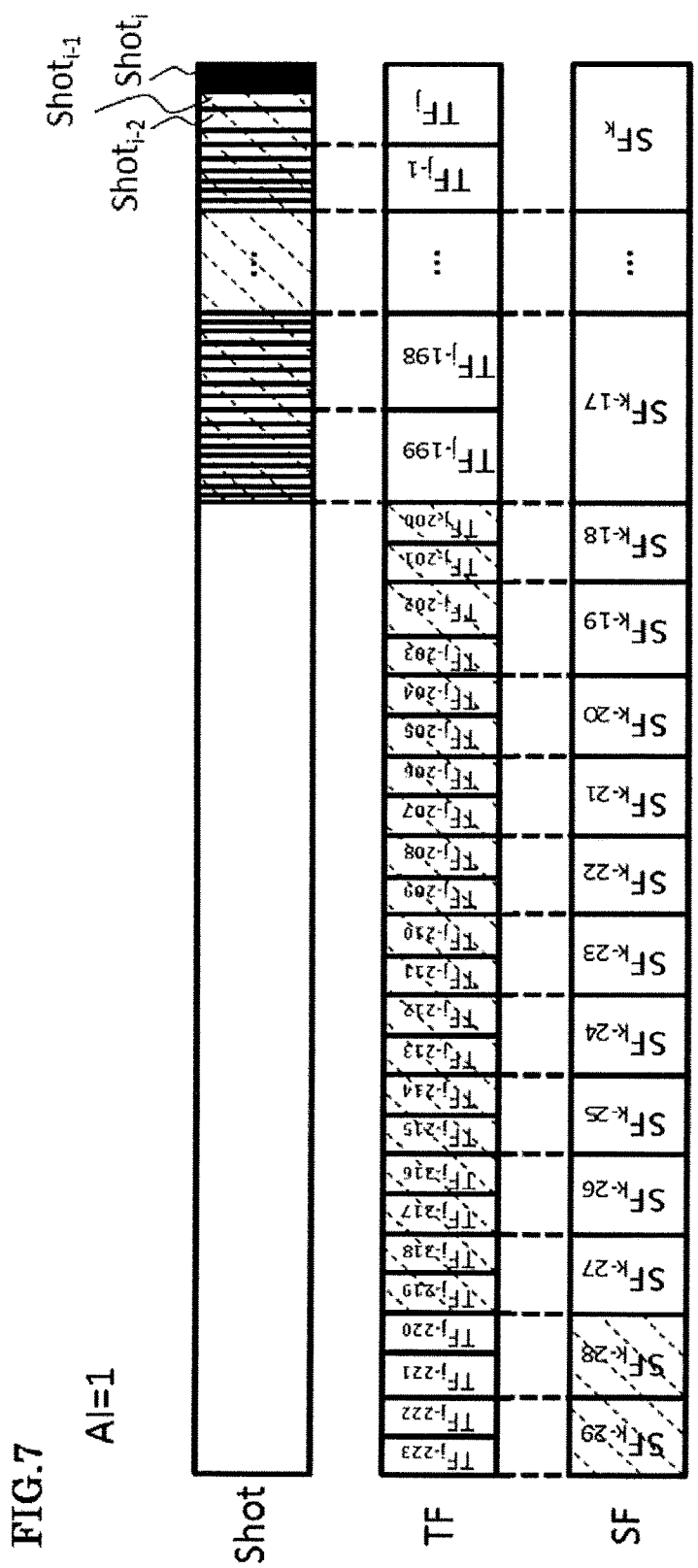
FIG. 7 is a conceptual diagram of merger in a deflection region in a case where the following expression is satisfied: attribute information (AI)=1 according to the first embodiment.

FIG. 7 is a conceptual diagram of merger in a deflection region in a case where the following expression is satisfied: AI=1 according to the present embodiment. In FIG. 7, a shot to be written is a $Shot_i$. A shot on the left side on the paper has been written before a shot on the right side on the paper in terms of time. FIG. 7 is also a conceptual diagram of a memory region of shot information, a memory region of TF information, and a memory region of SF information that have been stored in the memory 92. Behavior of the merger of the deflection region is expressed as a transition between the respective memory regions.

In a case where the following expression is satisfied: AI=1, the number of TFs in which the shots are not merged on calculation is 200. Thus, a heat transfer from an individual shot to the $Shot_i$ is calculated each for shots belonging to 200 TFs, from a $TF_j$ that is a TF to which the $Shot_i$ belongs, to a $TF_{j-199}$.

Next, the number of SFs in which the TFs are not merged on calculation is 10 in a case where the AI value is 1. Heat transfers from individual shots to the $Shot_i$ are merged on calculation each TF, from an $SF_{k-18}$ to which a $TF_{j-200}$ belongs, to an $SF_{k-27}$. Then, heat transfers from individual TFs to the $Shot_i$ are calculated. Thus, computational complexity is reduced in comparison to a case where a calculation is performed each shot. Here, as the above merger method, for example, a representative figure having an area equivalent to a total area of all shots positioned in a TF, is disposed so that the center of the representative figure is at the same position as the center of gravity of all of the shots positioned in the TF. Next, the sum of heat transfers from the individual shots to the $Shot_i$ is calculated as a heat transfer from the representative figure to the $Shot_i$.

For shots belonging to an $SF_{k-28}$ and an $SF_{k-29}$, merger is performed for each SF, and heat transfers from the individual SFs to the $Shot_i$ are calculated. Thus, computational complexity is reduced in comparison to a case where a calculation is performed for each shot or for each TF. Here, as the above merger method, for example, a representative figure having an area equivalent to a total area of all shots positioned in an SF, is disposed so that the center of the representative figure is at the same position as the center of gravity of all of the shots positioned in the SF. Next, the sum of heat transfers from the individual shots to the $Shot_i$ is calculated as a heat transfer from the representative figure to the $Shot_i$.

In a case where the AI value is 2, the number of TFs in which the shots are not merged is 1. The number of SFs in which the TFs are not merged is 1. The pattern writing data in association with an AI value of two is pattern writing data requiring no precision.

Figure 8:
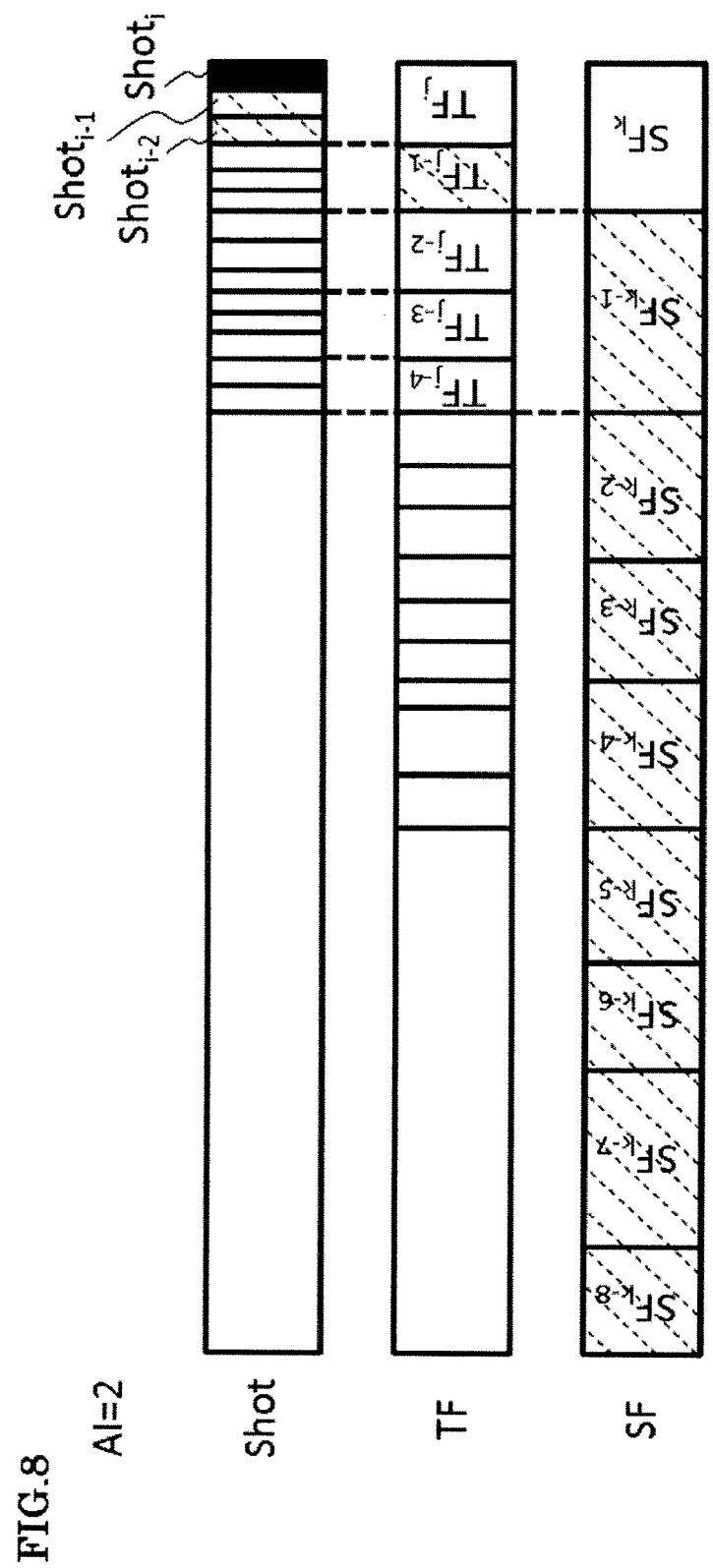
FIG. 8 is a conceptual diagram of merger in a deflection region in a case where the following expression is satisfied: AI=2 according to the first embodiment.

FIG. 8 is a conceptual diagram of merger in a deflection region in a case where the following expression is satisfied: AI=2 according to the present embodiment. A shot to be written is a $Shot_i$ in FIG. 8. A shot on the left side on the paper has been written before a shot on the right side on the paper in terms of time. FIG. 8 is also a conceptual diagram of a memory region of shot information, a memory region of TF information, and a memory region of SF information that have been stored in the memory 92. Behavior of the merger of the deflection region is expressed as a transition between the respective memory regions.

In a case where the following expression is satisfied: AI=2, the number of TFs in which shots are not merged on calculation is 1. Thus, heat transfers from individual shots to the $Shot_i$ are calculated only for a $Shot_{i-1}$ and a $Shot_{i-2}$ that are shots in a $TF_j$ to which the $Shot_i$ belongs.

Next, the number of SFs in which TFs are not merged on calculation is 1. Therefore, the TFs are not merged on calculation for an $SF_k$ to which the $Shot_i$ belongs. Note that, the heat transfers from the individual shots to the $Shot_i$ for the $TF_j$ is calculated as described above. Thus, heat transfers from individual shots to the $Shot_i$ are merged for a $TF_{j-1}$. Then, the heat transfers from the individual TFs to the $Shot_i$ are calculated. Thus, computational complexity is reduced in comparison to a case where a calculation is performed for each shot.

Merger is performed for each SF from an $SF_{k-1}$ to an $SF_{k-8}$. Then, heat transfers from the individual SFs to the $Shot_i$ are calculated. Thus, computational complexity is reduced in comparison to a case where a calculation is performed for each shot or for each TF.

Next, in the thermal diffusion calculating process (S124), the thermal diffusion calculator 64 calculates a temperature rise amount δTij caused by the heat transfers from the other shots written before the shot is written with the shot data, based on the approximation calculation method determined by the approximation-calculation-method determining unit 76. The temperature rise amount δTij indicates a temperature rise amount of an i-th shot caused by a heat transfer from another j-th shot or TF or SF. The temperature rise amount δTij depends on an elapsed time (ti−tj) until the shot is written at time ti after the other shot or TF or SF is written at time tj. The temperature rise amount δTij can be defined by the following Mathematical Formula (3) using a temperature rise A(Qj) depending on a total electric charge amount Qj of the shot or TF or SF written at the time tj, a thermal diffusion coefficient K, a grun range Rg, coordinates (Xi, Yi) of the shot written at the time ti, coordinates (Xj, Yj) of the other shot or TF or SF written at the time tj. Mathematical Formula (3) indicates an example of no-diffusion simplification during irradiation with rectangular parallelepiped approximation in a Z direction (depth).

[Mathematical Formula 3]

$$\delta T_{ij} = A(Q_j) \cdot \text{erf}\left(\frac{R_g}{2K\sqrt{t_i - t_j}}\right) \cdot \frac{1}{4\pi K^2(t_i - t_j)} \exp\left\{-\frac{(x_i - x_j)^2 + (y_i - y_j)^2}{4K^2(t_i - t_j)}\right\} \quad (3)$$

In Mathematical Formula 3, the thermal diffusion coefficient K is a coefficient expressed with $K^2[(mm)^2/s]=\lambda/(\rho Cp)$. Here, λ represents thermal conductivity [W/(K·m)]. ρ represents gram density [g/cm³]. Cp represents specific heat [J/(K·g)]. The grun range Rg in Mathematical Formula (3) is expressed by the following Mathematical Formula (4).

[Mathematical Formula 4]

$$Rg=(0.046/\rho)E^{1.75} \quad (4)$$

Note that the grun range Rg indicates mean range approximation in a depth direction when an electron beam having energy E [kcV] is vertically incident on a substance having gram density ρ[g/cm³]. A (Qj) can be expressed with the exemplary following expression: A=(E·Qj)/(ρCp·Rg·S). Here, Qj represents a total electric charge amount of $TF_j$ [fC] (femto coulomb). S represents an area of the shot or the representative figure [μm²]. E, ρ, Cp, and Rg represent the same as the above. erf( ) represents an error function in Mathematical Formula (3).

In the shot temperature calculating process (S126), based on the calculated temperature rise amount δTij, the shot temperature calculator 66 calculates, every shot, the temperature of the shot written with the shot data based on the heat transfers from the other shots, the TFs, or the SFs written before the shot. The shot temperature calculator 66 accumulatively adds respective temperature rise amounts δTij caused by the heat transfers from the other shots, the TFs, or the SFs. Then, for example, a representative temperature Ti of the shot is obtained. The representative temperature Ti is defined as the temperature of the shot. The representative temperature Ti is defined by the following Mathematical Formula (5).

[Mathematical Formula 5]

$$T_i = \sum_{j=1}^{n} \delta T_{ij} \qquad (5)$$

In the dose modulating process (S190), the dose modulator 68 inputs a dose D (first dose) required for each shot, and modulates the dose D (first dose) for each shot based on the representative temperature Ti of the shot written with the shot data. A dose D' (second dose) after the modulation can be obtained by the following expression:

$D'=D·f(Ti)$.

In the pattern writing process (S192), the beam irradiation time calculator 78 first calculates beam irradiation time every shot. The beam irradiation time can be obtained by dividing the dose D' after the modulation (second dose) by the current density H. The pattern writing processing unit 90 controls the deflection control circuit 120 so that the beam irradiation time is made in response to each of the shots when each of the shots is written. The pattern writing processing unit 90 controls the lithography mechanism 150 through the deflection control circuit 120 or the like so as to start the pattern writing processing. The lithography mechanism 150 writes a predetermined pattern on the target object 101 using the electron beam 200 having the dose D' (second dose), after the modulation, obtained every shot. In particular, operation is performed as follows: The deflection control circuit 120 outputs the digital signal that controls the beam irradiation time every shot, to the DAC amplifier unit 130. Then, the DAC amplifier unit 130 converts the digital signal into the analog signal, amplifies the analog signal, and applies the amplified signal, as a deflection voltage, to the blanking deflector 212.

The electron beam 200 emitted from the electron gun assembly 201 (emitting unit) is controlled by the blanking deflector 212 when passing through the blanking deflector 212 so as to pass through the blanking aperture plate 214 in a state where the beam has been turned on. In a state where the beam has been turned off, the entire beam is deflected so as to be shielded by the blanking aperture plate 214. The electron beam 200 that has passed through the blanking aperture plate 214 during a period during which a state where the beam has been turned off changes to the beam turned on and then the beam is turned off, becomes one shot of the electron beam. The blanking deflector 212 controls a direction of the electron beam 200 that passes through so as to generate a state where the beam has been turned on and a state where the beam has been turned off, alternately. For example, at least, no voltage is applied in a state where the beam has been turned on. A voltage is applied across the blanking deflector 212 when the beam is turned off. The dose per shot of the electron beam 200 irradiated to the target object 101 during the beam irradiation time each shot, is adjusted.

Note that the pattern writing schedule may be obtained based on the dose D' (second dose) after the modulation. A process of acquiring the pattern writing schedule may be repeated by performing the above temperature calculation, again. Then, the temperature calculation may be repeated until the pattern writing schedule converges. Alternatively, the number of calculations for the pattern writing schedule may be limited in response to the processing speed of a computer or the like.

As a pattern has been miniaturized, a dose has increased in order to reduce influence of shot noise. However, when the dose increases, a resist is heated and then precision of dimension degrades. The dose can be corrected based on the heating temperature of the resist in order to relax the degradation of the precision of dimension. However, it is necessary to calculate contribution of heat transfers from previous all shots. There is a problem that computational complexity exceedingly increases.

Calculation of the influence from the previous shots can be terminated prematurely based on the time difference between the shot being exposed and the previous shot, and the computational complexity can be reduced so that calculating time becomes shorter than pattern writing time. However, there is a risk that variations in a correction value occur, depending on whether a part of a pattern discontinued is dense or coarse. Correction cannot be performed accurately enough for the heating from other SFs, if terminated portion is too large.

The lithography apparatus according to the present embodiment includes the pattern-writing-data data storage unit and the shot dividing unit so that information on the degree of precision requirement is provided to a pattern figure including each shot. Next, the indicator data storage unit, the pattern writing schedule creating unit, and the approximation-calculation-method determining unit are provided so that a method of coordination can be varied in response to the degree of precision requirement. Accordingly, computational complexity necessary for inhibiting a variation of a pattern in size due to resist heating, has to be elevated for a pattern requiring precision. Meanwhile, the computational complexity can be lowered for a pattern not requiring precision. Accordingly, the computational complexity necessary for inhibiting the variation of a pattern in size due to the resist heating is easily optimized.

As described above, according to the lithography apparatus and the lithography method, there can be provided a lithography apparatus and a lithography method capable of inhibiting the variation of a pattern in size due to the resist heating, optimizing the computational complexity.

Second Embodiment

A lithography apparatus according to the present embodiment is different from the first embodiment in that an indicator is a time during which merger in a correction section region is not performed when an approximation calculation of a heat transfer is performed. Here, the descriptions of details that duplicate with respect to the first embodiment will be omitted.

Table 2 illustrates, as an indicator, a time during which the merger in the correction section region is not performed upon the approximation calculation of a heat transfer, in response to each AI value.

TABLE 2

| AI value | Time with shots not merged | Time with TFs not merged |
| --- | --- | --- |
| 0 | ∞ | ∞ |
| 1 | 4 µs | 40 µs |
| 2 | 1 µs | 10 µs |

In a case where the AI value is zero, the time during which shots are not merged on calculation is infinite. The time during which TFs are not merged on calculation is infinite. That is, merger is not performed on calculation for pattern writing data in association with an AI value of zero.

In a case where the AI value is 1, the time while the shots are not merged on calculation is 4 µs, and the time while the TFs are not merged on calculation is 40 µs. In a case where the AI value is zero, the time while the shots are not merged on calculation is 1 µs, and the time while the TFs are not merged on calculation is 10 µs.

With an example in a case where the AI value is 1, merger is not performed on calculation for the shots written within 4 µs before a shot to be calculated. A heat transfer from each of the shots to the shot to be calculated is individually calculated. Next, heat transfers from the individual shots to the shot to be calculated are merged into TF for the shots written within 40 µs before the shot to be calculated, except for the shots written within 4 µs before the shot to be calculated. Therefore, computational complexity is reduced in comparison to a case where a calculation is performed for each shot. Merger is performed into SF for the shots written beyond 40 µs before the shot to be calculated. A heat transfer from the individual SF to the shot to be calculated is calculated. Thus, computational complexity is reduced in comparison to a case where a calculation is performed for each shot or TF.

The lithography apparatus according to the present embodiment separates the merger of the shots or the TFs on calculation in terms of time. Thus, the approximation calculation method can be determined more simply.

As described above, according to the lithography apparatus and the lithography method of the present embodiment, there can be provided a lithography apparatus and a lithography method capable of inhibiting a variation of a pattern in size due to resist heating, optimizing the computational complexity.

Third Embodiment

A lithography apparatus according to the present embodiment is different from the first and second embodiments in that an indicator is a temperature rise amount for determining whether merger in a correction section region is required upon an approximation calculation of a heat transfer. Here, the descriptions of points that duplicate with respect to the first and second embodiments will be omitted.

Figure 9:
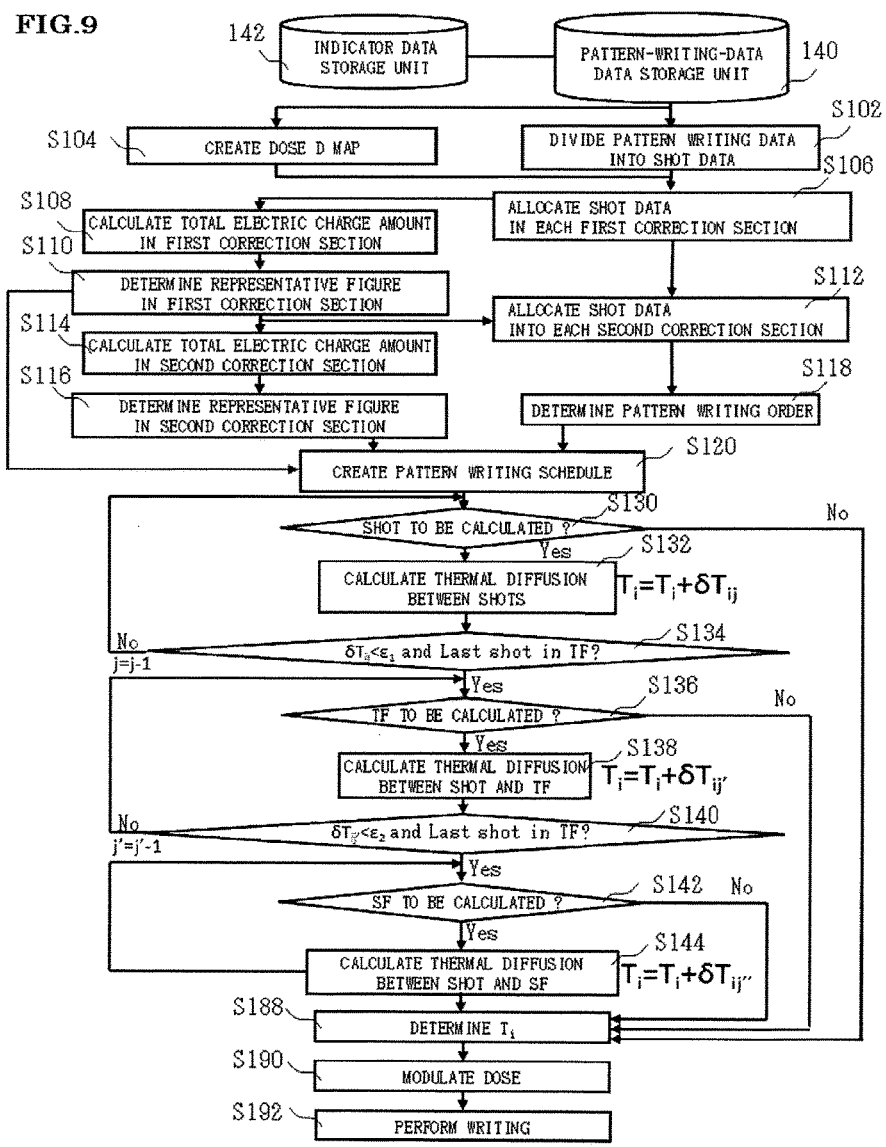
FIG. 9 is a flow chart of main processes of a lithography method according to a third embodiment.
Figure 10:
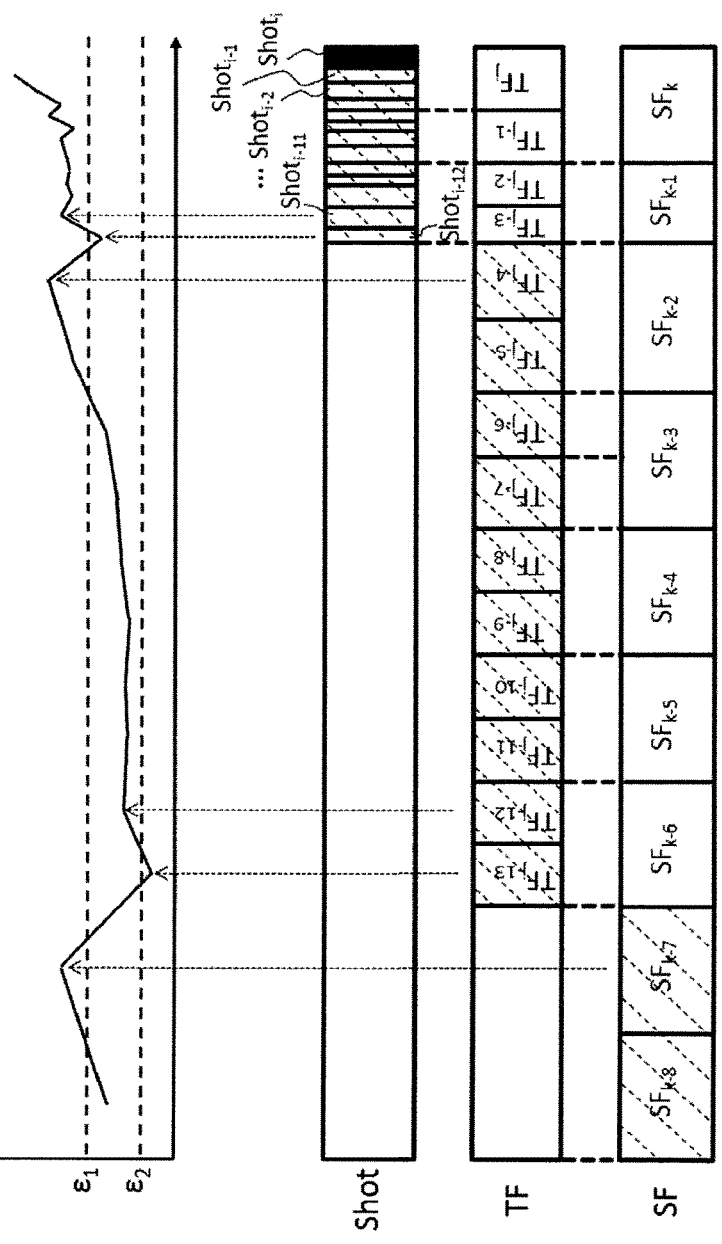
FIG. 10 is a conceptual diagram of merger in a deflection region according to the third embodiment.
Figure 11:
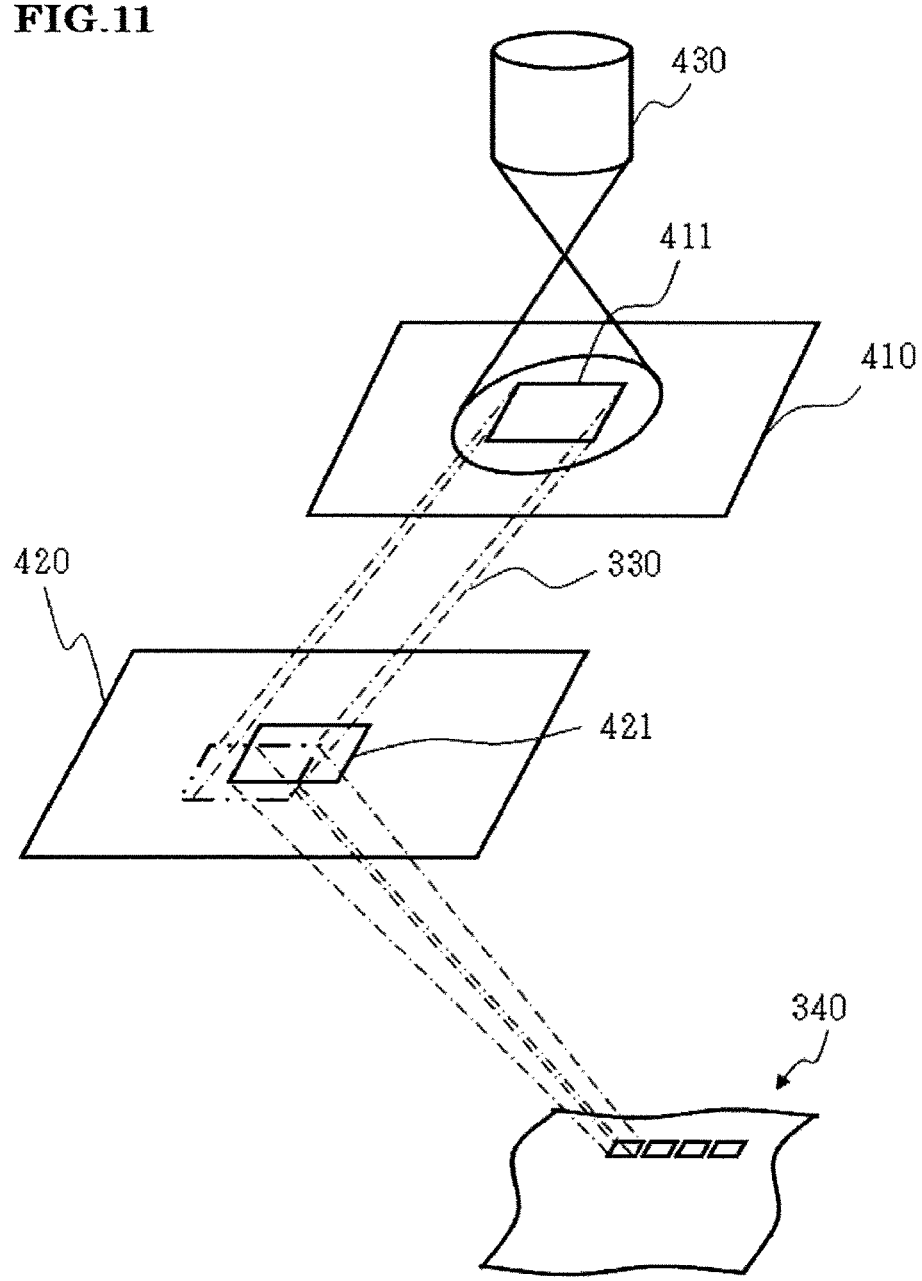
FIG. 11 is a schematic view for describing operation of a variable-shaped electron beam lithography apparatus in the related art.

FIG. 9 is a flow chart of main processes of a lithography method according to the present embodiment. FIG. 10 is a conceptual diagram of merger in a reflection region according to the present embodiment.

Table 3 illustrates, as an indicator, the temperature rise amount for determining whether the merger in a correction section region is required, in response to each AI value, according to the present embodiment.

TABLE 3

| AI value | ε1 | ε2 |
| --- | --- | --- |
| 0 | 0 K | 0 K |
| 1 | 0.01 K | 0.005 K |
| 2 | 0.04 K | 0.02 K |

In a case where the AI value is zero, a temperature rise amount $\varepsilon_1$ of a shot in which shots are not merged on calculation is 0 K. A temperature rise amount $\varepsilon_2$ of a TF in which TFs are not merged on calculation is 0 K. That is, merger is not performed for pattern writing data in association with an AI value of zero.

In a case where the AI value is 1, $\varepsilon_1$ is 0.01 K and $\varepsilon_2$ is 0.005 K. In a case where the AI value is 2, $\varepsilon_1$ is 0.04 K and $\varepsilon_2$ is 0.02 K.

According to the present embodiment, a pattern writing schedule creating unit 56 examines whether there is a shot for which calculation of a temperature rise amount δTij should be performed (S130). In a case where there is the shot for which calculation of a temperature rise amount δTij should be performed, in a thermal diffusion between-shots calculating process (S132), a thermal diffusion calculator 64 calculates a temperature rise amount δTij caused by heat transfers from the respective shots to the shot to be calculated (Shot$_i$). Next, a shot temperature calculator 66 calculates a representative temperature Ti. Meanwhile, in a case where there is not the shot for which calculation of a temperature rise amount δTij should be performed, the shot temperature calculator 66 determines the representative temperature Ti (S188).

Next, a temperature rise amount distinguishing unit 80 distinguishes whether the temperature rise amount δTij from the shot to the Shot$_i$ is less than $\varepsilon_1$. When the δTij is $\varepsilon_1$ or more, the processing goes back to S130. Meanwhile, when the δTij is less than $\varepsilon_1$, the pattern writing schedule creating unit 56 examines whether the shot is the last shot for which the δTij should be calculated in the TF to be calculated (S134).

In S134, when the shot is the last shot for which the δTij should be calculated, the pattern writing schedule creating unit 56 examines whether there is a TF for which a temperature rise amount δTij' should be calculated (S136). When there is a TF for which a temperature rise amount δTij' should be calculated, in a thermal diffusion between-shot-and-TF calculating process (S138), the thermal diffusion calculator 64 calculates a temperature rise amount δTij' caused by heat transfers from respective TFs to the Shot$_i$. The shot temperature calculator 66 calculates the representative temperature Ti using the temperature rise amount δTij'.

On the other hand, in S134, when the shot is not the last shot for which the δTij should be calculated, i.e., when a shot for which the δTij should be calculated is left, the temperature rise amount δTij and the representative temperature Ti for all the shots to be calculated are calculated in the TF to be calculated, in S130 and S132. After the temperature rise amount δTij and the representative temperature Ti for the last shot is calculated in the TF to be calculated (S134), the processing goes to S136.

With an example in FIG. 10, the δTij is larger than ε₁ from the Shot$_i$ to a Shot$_{i-11}$. Thus, the temperature rise amount δTij and the representative temperature Ti are calculated in the thermal diffusion between-shots calculating process (S132). The following expression is satisfied in a Shot$_{i-12}$: δTij<ε₁, and the Shot$_{i-12}$ is the last shot in TF$_{j-3}$ (S134). Next, shots written in a TF$_{j-4}$ and before the TF$_{j-4}$ in terms of time are determined as shots in the TFs for which the δTij should be calculated, the thermal diffusion calculator 64 calculates the temperature rise amount δTij' caused by the heat transfers from the respective TFs to the Shot$_i$ and the shot temperature calculator 66 calculates the representative temperature Ti in the thermal diffusion between-shot-and-TF calculating process (S138). Note that, a temperature rise amount calculated by merger on calculation per TF may be larger than a temperature rise amount calculated per shot because the area of correction section to be calculated becomes large. In FIG. 10, a temperature rise amount caused by a heat transfer from the TF$_{j-4}$ to the Shot$_i$ is also larger than a temperature rise amount caused by a heat transfer from a Shot$_{i-12}$ to the Shot$_i$.

Next, the temperature rise amount distinguishing unit 80 distinguishes whether the temperature rise amount δTij' from the TF to the Shot$_i$ is smaller than ε₂ (S140). When the δTij' is ε₂ or more, the processing goes back to S136. On the other hand, when the δTij' is less than ε₂, the pattern writing schedule creating unit 56 examines whether the TF is the last TF for which the δTij' should be calculated in the SF to be calculated (S140).

In S140, when the TF is the last TF for which the δTij' should be calculated, the pattern writing schedule creating unit 56 examines whether there is a SF for which a temperature rise amount δTij" should be calculated (S142). When there is a SF for which a temperature rise amount δTij" should be calculated, the thermal diffusion calculator 64 calculates a temperature rise amount δTij" caused by heat transfers from respective SFs to the Shot$_i$. The shot temperature calculator 66 calculates the representative temperature Ti using the temperature rise amount δTij". The processing is performed for all the SFs to be calculated, and the representative temperature Ti is determined (S188).

On the other hand, in S140, when the TF is not the last TF for which the δTij' should be calculated, i.e., when a TF for which the δTij' should be calculated is left in the SF to be calculated, the temperature rise amount δTij' and the representative temperature Ti for all the TFs to be calculated are calculated in the SF to be calculated, in S136 and S138. After the temperature rise amount δTij' and the representative temperature Ti of the last TF is calculated in the SF to be calculated (S140), the processing goes to S142.

With the example in FIG. 10, the following expression is satisfied from the TF$_{j-4}$ to a TF$_{j-13}$: δTij'>ε₂. Thus, the temperature rise amount δTij' and the representative temperature Ti are calculated in the thermal diffusion between-shot-and-TF calculating process (S138). The following expression is satisfied in a TF$_{j-13}$: δTij'<ε₂. The temperature rise amount δTij" caused by the heat transfers from the respective SFs to the Shot$_i$, and the representative temperature Ti are calculated, in the thermal diffusion between-shot-and-SF calculating process (S144), for shots written in an SF$_{k-7}$ and before the SF$_{k-7}$ in terms of time. Note that, a temperature rise amount calculated by merger on calculation per SF may be larger than a temperature rise amount calculated per TF because the area of correction section to be calculated becomes large. In FIG. 10, a temperature rise amount caused by a heat transfer from the SF$_{k-7}$ to the Shot$_i$ is also larger than a temperature rise amount caused by a heat transfer from the TF$_{j-13}$ to the Shot$_i$.

The following processes are the same as in the first and second embodiments and will be omitted.

According to the lithography apparatus according to the present embodiment, coordination is performed based on the temperature rise amount. Thus, computational complexity can be reduced while a calculation is performed with high precision even for a shot, a TF, or an SF particularly having a large temperature rise amount.

As described above, according to the lithography apparatus and the lithography method of the present embodiment, there can be provided a lithography apparatus and a lithography method capable of inhibiting a variation of a pattern in size due to resist heating, optimizing the computational complexity.

According to the embodiments, parts, such as apparatus configurations and examining methods not directly necessary for describing the present disclosure have been omitted. For example, a necessary apparatus configuration and an examining method can be appropriately selected and used. In addition, all charged particle beam lithography apparatuses and charged particle beam lithography methods that include an element according to the present disclosure and can be appropriately designed and changed by a person skilled in the art, are included in the scope of the present disclosure. The scope of the present disclosure is defined by the scope of the claims and the scope of equivalents of the claims.

What is claimed is:

1. A charged particle beam lithography apparatus comprising:
   a pattern-writing-data data storage processing circuitry configured to store pattern writing data in association with pattern attribute information;
   a shot dividing processing circuitry configured to divide the pattern writing data into shot data in association with the pattern attribute information;
   an indicator data storage processing circuitry configured to store an indicator for determining correction section regions to be merged on calculation in an approximation calculation of heat transfers, the indicator being associated with the pattern attribute information;
   a pattern writing schedule creator configured to create a pattern writing schedule based on the shot data;
   an approximation-calculation-method determining processing circuitry configured to determine the approximation calculation of the heat transfers from other shots written before a shot to be written, the shot being associated with the shot data to be written, based on the pattern writing schedule and the indicator;
   a thermal diffusion calculator configured to calculate a temperature rise amount caused by the heat transfers from the other shots written before the shot to be written, the shot being associated with the shot data to be written, based on the approximation calculation method;
   a shot temperature calculator configured to calculate a representative temperature of the shot to be written with the shot data, based on the temperature rise amount;
   a dose modulator configured to modulate a dose of the shot to be written with the shot data, based on the representative temperature;
   a lithography mechanism including a charged particle beam source, a deflector, and a stage on which the target object is placed, and to perform writing based on a modulated dose and the pattern writing schedule; and a representative-figure-in-correction-section determining processing circuitry configured to create a representative figure having an area equivalent to a total area of all of the shots positioned in the correction section region, wherein a location of a center of gravity of all of the shots positioned in each of the correction section regions to be merged on calculation is disposed so as to correspond to a center of the representative figure, and the heat transfers from the shots positioned in each of the correction section regions to the shot to be written is calculated as each of the heat transfers from the representative figure to the shot to be written.

2. A charged particle beam lithography method comprising:

dividing pattern writing data in association with pattern attribute information into shot data in association with the pattern attribute information;

creating a pattern writing schedule based on the shot data;

determining an approximation calculation of heat transfers from other shots written before a shot to be written, the shot being associated with the shot data to be written, based on the pattern writing schedule and an indicator for determining correction section regions to be merged in the approximation calculation of the heat transfers, the indicator being associated with the pattern attribute information;

calculating a temperature rise amount caused by the heat transfers from the other shots written before the shot to be written, the shot being associated with the shot data to be written, based on the approximation calculation method;

calculating a representative temperature of the shot to be written with the shot data, based on the temperature rise amount;

modulating a dose of the shot to be written with that shot data, based on the representative temperature; and performing writing based on a modulated dose and the pattern writing schedule, wherein a method of the merger on calculation includes:

creating a representative figure having an area equivalent to a total area of all of the shots positioned in the correction section region;

disposing a location of a center of gravity of all of the shots positioned in each of the correction section regions to be merged on calculation, so as to correspond to a center of the representative figure; and calculating the heat transfers from the shots positioned in each of the correction section regions to the shot to be written as each of the heat transfers from the representative figure to the shot to be written.

* * * * *